(12) United States Patent
Muraoka et al.

(10) Patent No.: US 7,993,488 B2
(45) Date of Patent: Aug. 9, 2011

(54) MICROWAVE PLASMA PROCESSING DEVICE AND GATE VALVE FOR MICROWAVE PLASMA PROCESSING DEVICE

(75) Inventors: Sunao Muraoka, Nirasaki (JP); Hideki Nagaoka, Nirasaki (JP); Masakazu Ban, Nirasaki (JP); Cai Zhong Tian, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 981 days.

(21) Appl. No.: 11/773,539

(22) Filed: Jul. 5, 2007

(65) Prior Publication Data
US 2008/0006371 A1  Jan. 10, 2008

(30) Foreign Application Priority Data
Jul. 6, 2006  (JP) .............................. P2006-186578

(51) Int. Cl.
*H01L 21/306* (2006.01)
*C23C 16/00* (2006.01)

(52) U.S. Cl. .......................... 156/345.41; 118/723 MW (58) Field of Classification Search .......... 118/723 MW, 118/723 MA, 723 ME, 723 MR; 156/345.36, 156/345.41, 345.42
See application file for complete search history.

(56) References Cited

U.S. PATENT DOCUMENTS
6,634,845 B1 * 10/2003 Komino ..................... 414/217
6,797,111 B2 * 9/2004 Hongoh et al. ......... 156/345.41

FOREIGN PATENT DOCUMENTS
JP         2005-32805         2/2005
* cited by examiner

*Primary Examiner* — Luz L. Alejandro
(74) *Attorney, Agent, or Firm* — Oblon, Spivak, McClelland, Maier & Neustadt, L.L.P.

(57) ABSTRACT

A gate valve includes a plate-shaped valve element which is rectangular-shaped to suit the shape of an opening of a processing chamber and has a size larger than the opening. A hermetically sealing member to perform hermetic sealing by abutting on and being pressed against an outer side of the processing chamber is provided in the valve element. A microwave reflecting mechanism which is formed in a groove shape so as to surround a periphery of the hermetically sealing member is provided at an outer peripheral portion of the hermetically sealing member.

12 Claims, 13 Drawing Sheets

MICROWAVE PLASMA PROCESSING DEVICE AND GATE VALVE FOR MICROWAVE PLASMA PROCESSING DEVICE

CROSS-REFERENCE TO RELATED APPLICATIONS

This application is based upon and claims the benefit of priority from the prior Japanese Patent Application No. 2006-186578, filed on Jul. 6, 2006; the entire contents of which are incorporated herein by reference.

BACKGROUND OF THE INVENTION

1. Field of the Invention

The present invention relates to a microwave plasma processing device which processes an object to be processed by generating plasma using a microwave and a gate valve for the microwave plasma processing device.

2. Description of the Related Art

For example, in a semiconductor device manufacturing process, microwave plasma processing devices which perform predetermined processing by generating plasma using a microwave and causing this plasma to act on an object to be processed have been conventionally used. As one of these microwave plasma processing devices, the one that continuously performs processing while carrying the object to be processed by a belt conveyor or the like under atmospheric pressure has been known. It has been known that such a microwave plasma processing device is provided with a microwave leakage preventing structure to prevent leakage of plasma from a plasma head portion which generates the plasma by a microwave to its surroundings (for example, see JP-A 2005-32805).

On the other hand, in a microwave plasma processing device which performs predetermined processing by housing an object to be processed in a processing chamber and generating plasma under a vacuum atmosphere, the inside of the processing chamber needs to be hermetically sealed. Therefore, an opening to carry the object to be processed in and out is openably and closably sealed with a valve element of a gate valve or the like, and thereby the inside of the processing chamber is hermetically isolated from the outside thereof during plasma processing.

In the above conventional microwave plasma processing device which performs the plasma processing under the vacuum atmosphere, for example, in a portion where members constituting the processing chamber are fixed while being brought into contact with each other, leakage of the microwave to the outside is prevented, for example, by putting a spirally formed member called a spiral shield between these members.

However, as a result of a detailed investigation of the present inventor et al., it turns out that the conventional microwave plasma processing device with the above structure has the following problem. Namely, when the plasma processing is performed with the plasma in a steady state, the microwave is absorbed by the plasma, so that the microwave never leaks to the outside of the processing chamber. However, when there is no plasma, for example, when the plasma is ignited, there is a possibility that the microwave spreads over respective portions inside the processing chamber, from a slight gap between the valve element formed in the gate valve portion and a processing chamber wall, is transmitted through a hermetically blocking member (so-called O-ring or the like) made of resin or the like and leaks to the outside of the processing chamber. In some cases, this leaked microwave causes an undesired electric discharge, for example, in a transfer chamber or the like placed adjacent to the processing chamber.

When such microwave leakage as described above is prevented, a structure in which the valve element and the processing chamber are brought into direct contact with each other and no gap is formed therebetween is conceivable. However, in the case of the above structure in which the valve element and the processing chamber are brought into direct contact, the metal valve element and the metal processing chamber come into direct contact at every opening/closing operation of the valve element, so that a possibility that so-called particles occurs increases, and a possibility that the object to be processed is badly influenced increases. Hence, the above structure is undesirable in terms of suppression of the occurrence of the particles.

SUMMARY OF THE INVENTION

An object of the present invention is to provide a microwave plasma processing device capable of suppressing leakage of a microwave to the outside without causing an increase in particles, for example, when plasma is ignited, and reducing a possibility that an electric discharge or the like occurs due to the leaked microwave compared to the related art and a gate valve for the microwave plasma processing device.

An aspect of the present invention is a microwave plasma processing device which processes an object to be processed by plasma generated by a microwave, comprising: a processing chamber having an opening to carry the object to be processed in and out; a microwave introducing mechanism to introduce the microwave into the processing chamber; a valve element openably and closably blocking the opening; an exhauster evacuating the processing chamber; a hermetically sealing member lying between an outer atmospheric portion of a peripheral portion of the opening of the processing chamber and the valve element to hermetically seal a space therebetween when the opening is blocked by the valve element; and a groove-shaped microwave reflecting mechanism located so as to surround at least a periphery of the opening and reflecting the microwave leaking to an outside from the opening when the opening is blocked by the valve element.

Another aspect of the present invention is a gate valve for a microwave plasma processing device which is placed in the microwave plasma processing device including an opening portion to carry an object to be processed into and out of a processing chamber, introducing a microwave into the processing chamber to generate plasma while the processing chamber is evacuated, and processing the object to be processed by the plasma, the gate valve comprising: a valve element openably and closably blocking the opening portion; a hermetically sealing member lying between an outer atmospheric portion of a peripheral portion of the opening portion of the processing chamber and the valve element to hermetically seal a space therebetween when the opening portion is blocked by the valve element; and a groove-shaped microwave reflecting mechanism located so as to surround at least a periphery of the opening portion and reflecting the microwave leaking to an outside from the opening portion when the opening portion is blocked by the valve element.

DETAILED DESCRIPTION

Figure 1:
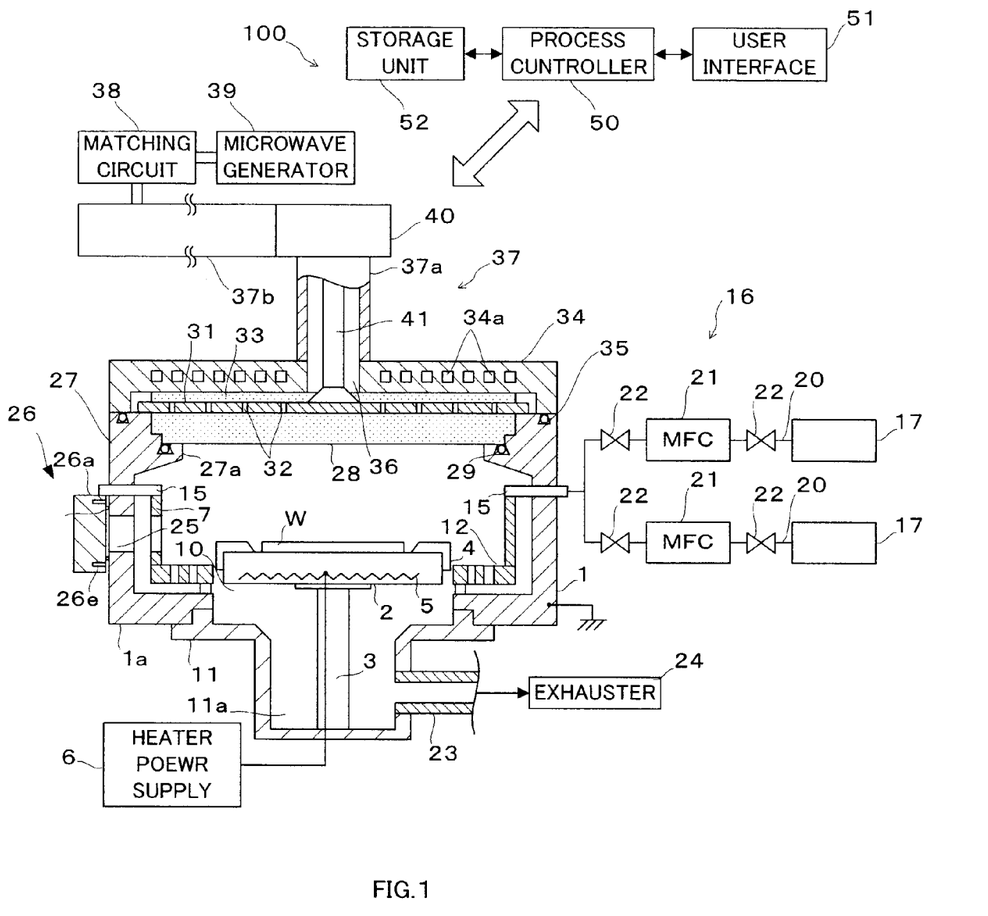
FIG. 1 is a view showing the constitution of a microwave plasma processing device according to an embodiment of the present invention.

FIG. 1 shows the constitution of a microwave plasma processing device 100 according to the present embodiment. The microwave plasma processing device 100 is an RLSA microwave plasma processing device which radiates a microwave guided from a microwave generating source into a chamber using a planar antenna (Radial Line Slot Antenna) in which plural slots are formed in a predetermined pattern to form plasma.

This microwave plasma processing device 100 includes a nearly cylindrical processing chamber 1 which is hermetically structured and grounded. In a nearly central portion of a bottom wall 1a of the processing chamber 1, a circular opening portion 10 is formed, and an exhaust chamber 11 which communicates with the opening portion 10 and projects downward is provided on the bottom wall 1a. A susceptor 2 made of ceramic such as AlN to horizontally support a wafer W being a substrate to be processed is provided inside the processing chamber 1.

This susceptor 2 is supported by a cylindrical supporting member 3 made of ceramic such as AlN extending upward from the center of a bottom portion of the exhaust chamber 11. A guide ring 4 to guide the wafer W is provided at an outer edge portion of the susceptor 2. A resistance heating type heater 5 is embedded in the susceptor 2. This heater 5 heats the susceptor 2 by power feeding from a heater power supply 6, and using this heat, heats the wafer W. At this time, the temperature is controllable, for example, within a range from a room temperature to 800° C. Incidentally, a cylindrical liner made of a dielectric such as quartz is provided at an inner periphery of the processing chamber 1.

In the susceptor 2, a wafer supporting pin (not shown) to support and raise/lower the wafer W is provided to be projectable from and retractable into the surface of the susceptor 2.

An annular gas introducing member 15 is provided in a sidewall of the processing chamber 1. A gas supply system 16 is connected to this gas introducing member 15. The gas introducing member 15 may be placed in a shower form. This gas supply system 16 includes plural gas supply sources 17 (only two are shown in FIG. 1) to supply predetermined gases such as Ar, $O_2$, $N_2$, and $H_2$. The gases from these gas supply sources 17 respectively reach the gas introducing member 15 via gas lines 20 and are introduced into the processing chamber 1 from the gas introducing member 15. A mass flow controller 21 and opening/closing valves 22 before and behind the mass flow controller 21 are provided in each of the gas lines 20.

An exhaust pipe 23 is connected to a side face of the above exhaust chamber 11, and an exhaust device 24 including a high-speed vacuum pump is connected to the exhaust pipe 23. By operating this exhaust device 24, gas in the processing chamber 1 is discharged into a space 11a of the exhaust chamber 11 and exhausted via the exhaust pipe 23. Consequently, it becomes possible to reduce the pressure in the processing chamber 1 to a predetermined degree of vacuum, for example, 0.133 Pa at high speed.

In the sidewall of the processing chamber 1, a carry-in/out rectangular opening 25 to carry the wafer W into and out of a transfer chamber (not shown) adjacent to the plasma processing device 100 is provided. This opening 25 is openable and closable by a gate valve 26. The detailed constitution of this gate valve 26 will be described later.

An upper portion of the processing chamber 1 is an opening portion. An annular supporting member 27 is provided along a peripheral edge portion of this opening portion, and a projecting portion 27a projecting inward is formed in the supporting member 27. A microwave transmitting plate 28 made of a dielectric, for example, ceramic such as quartz or $Al_2O_3$ and transmitting the microwave is hermetically provided on the projecting portion 27a via a seal member 29. Accordingly, the inside of the processing chamber 1 is hermetically held.

Figure 2:
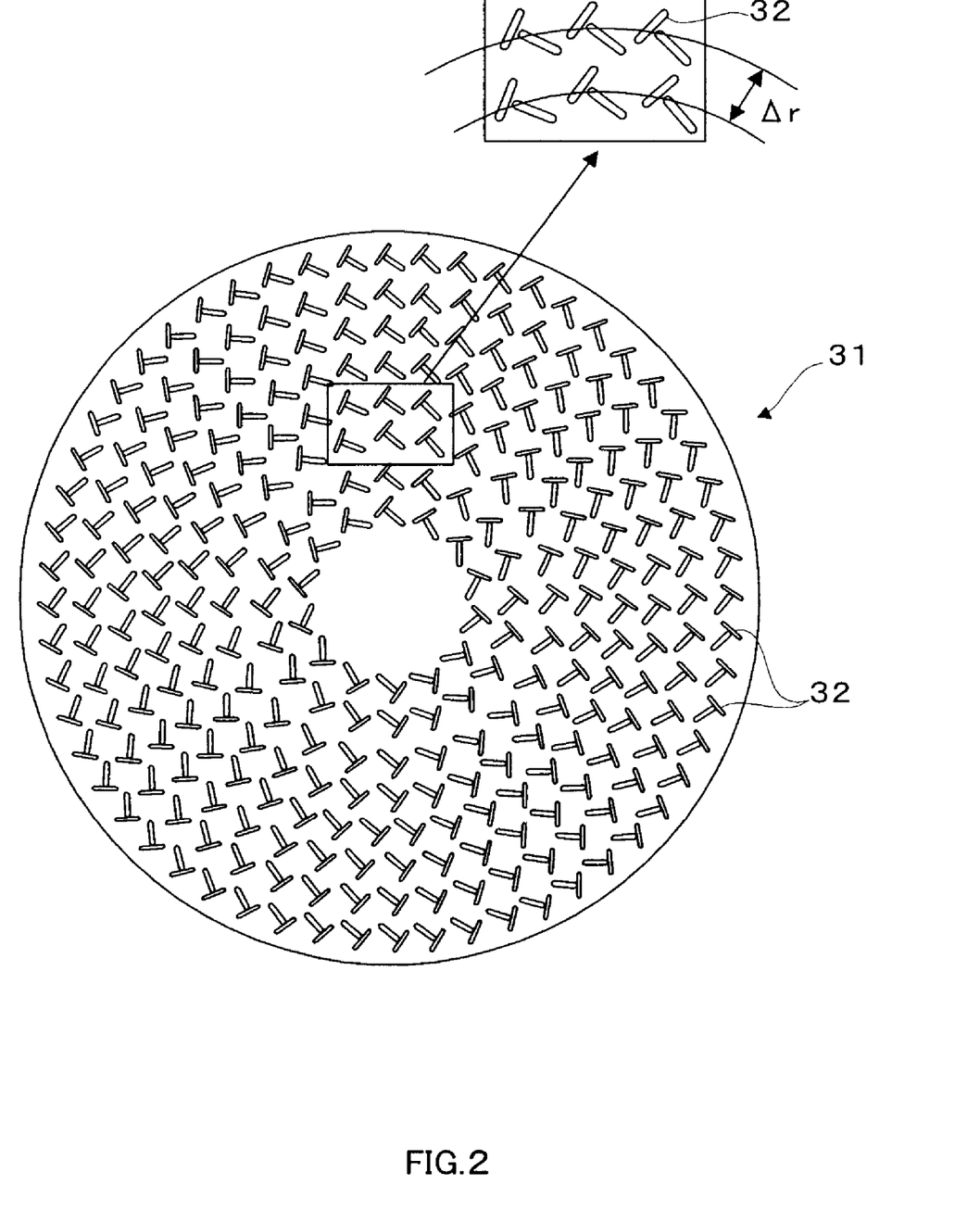
FIG. 2 is a view showing the constitution of a planar antenna member of the microwave plasma processing device in FIG. 1.

A disk-shaped planar antenna member 31 is provided above the microwave transmitting plate 28 so as to face the susceptor 2. This planar antenna member 31 is disposed at an upper end of the supporting member 27. The planar antenna member 31 is made of a conductor, for example, a copper plate or an aluminum plate whose surface is plated with silver or gold, and plural microwave radiation holes (slots) 32 are formed therethrough in a predetermined pattern. This microwave radiation hole 32 has, for example, a long slot shape as shown in FIG. 2, the adjacent microwave radiation holes 32 are arranged so as to slot with each other, and typically at right angles (in a T-shape) as shown, and these plural microwave irradiation holes 32 are arranged in a concentric pattern. The planar antenna member 31 constitutes an RLSA antenna. The length and arrangement interval of the microwave radiation holes 32 are determined according to a wavelength ($\lambda$) of the microwave, and they are arranged, for example, so that the interval between the microwave radiation holes 32 is $\lambda/2$, $\lambda/4$, or $\lambda$. Further, the microwave radiation hole 32 may have another shape such as a circular shape, an arc shape, or the like. Furthermore, the arrangement form of the microwave radiation holes 32 is not particularly limited, and, for example, they can be arranged in a spiral pattern, a radial pattern, or the like instead of the concentric pattern. A retardation member 33 made of a dielectric having a larger dielectric constant than a vacuum, for example, quartz, resin, or ceramic is provided on an upper face of the planar antenna member 31.

On the upper face of the processing chamber 1, a shield cover 34 made of a metallic material such as aluminum or stainless steel is provided so as to cover these planar antenna member 31 and retardation member 33. The upper face of the processing chamber 1 and the shield cover 34 are sealed with a seal member 35. Further, a measure to prevent leakage of the microwave is taken, for example, by putting the above spiral shield (not shown) between the processing chamber 1 and the shield cover 34. Cooling water passages 34a are formed in the shield cover 34, and this shield cover 34 is grounded.

An opening portion 36 is formed in the center of an upper wall of the shield cover 34, and a waveguide 37 is connected to this opening portion 36. A microwave generator 39 is connected to an end portion of the waveguide 37 via a matching circuit 38. Hence, the microwave, for example, having a frequency of 2.45 GHz generated in the microwave generator 39 is propagated to the above planar antenna member 31 via the waveguide 37. As the frequency of the microwave, 8.35 GHz, 1.98 GHz, or the like also can be used.

The waveguide 37 includes a coaxial waveguide 37a having a sectional circular shape extending upward from the opening portion 36 of the above shield cover 34 and a rectangular waveguide 37b having a sectional rectangular shape extending in a horizontal direction. A mode converter 40 is provided therebetween. An internal conductor 41 extends in the middle of the coaxial waveguide 37a, and its lower end portion is connected and fixed to the center of the planar antenna member 31.

Respective constituent portions of the microwave plasma processing device 100 are connected to and controlled by a process controller 50. A user interface 51 constituted of a keyboard for a process manager to perform an operation of inputting a command to manage the microwave plasma processing device 100, a display to display a working situation of the microwave plasma processing device 100 in a visualized form, and so on is connected to the process controller 50.

Further, a storage unit 52 is connected to the process controller 50. A control program to realize various processings performed in the microwave plasma processing device 100 by control of the process controller 50 and a control program to cause each of the constituent portions of the microwave plasma processing device 100 to execute processing according to a processing condition, that is, recipes are stored in the storage unit 52. The recipes may be stored in a computer storage medium such as a hard disk or a semiconductor memory or may be set in a predetermined position of the storage unit 52 while being stored in a portable computer storage medium such as a CDROM or a DVD. Further, the recipes may be properly transmitted from another device, for example, via a dedicated line.

Then, by reading an arbitrary recipe from the storage unit 52 by an instruction or the like from the user interface 51 and causing the process controller 50 to execute the recipe, desired processing in the microwave plasma processing device 100 is performed under the control of the process controller 50.

Figure 3:
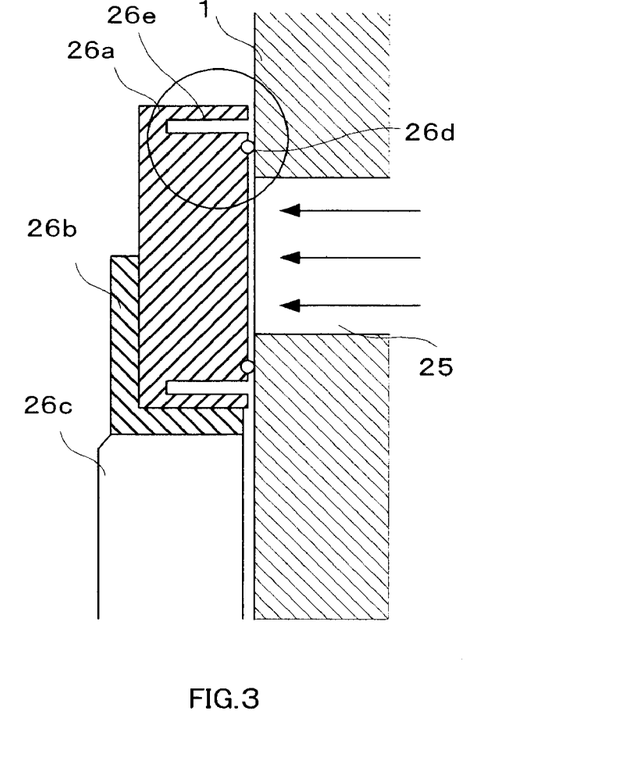
FIG. 3 is a longitudinal sectional view showing the constitution of a gate valve of the microwave plasma processing device in FIG. 1.
Figure 4:
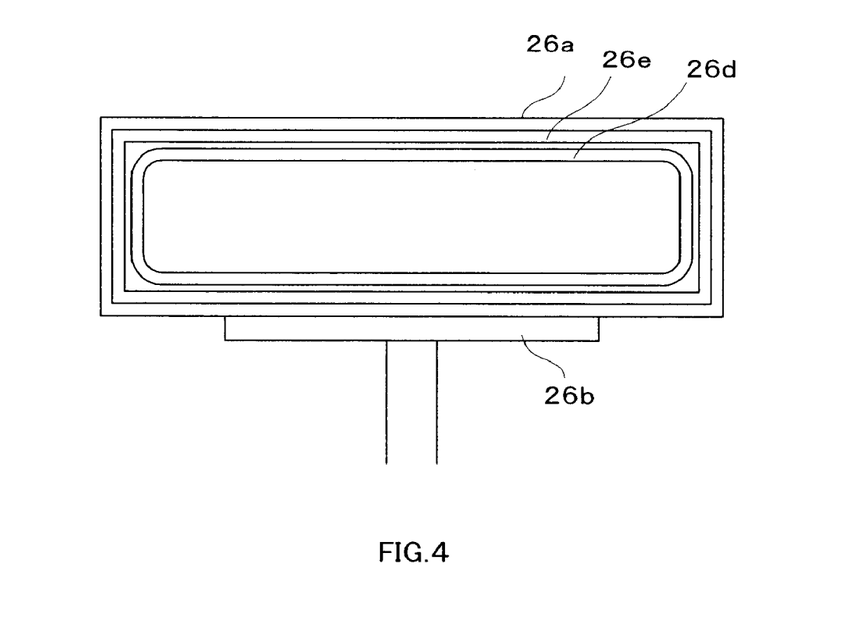
FIG. 4 is a front view showing the constitution of a valve element in FIG. 1.

Next, the detailed constitution of the above gate valve 26 will be described. As shown in FIGS. 3 and 4, the gate valve 26 includes a plate-shaped valve element 26a which is rectangular-shaped to suit the shape of the opening 25 and has a size larger than the opening 25. This valve element 26a is connected to a valve element supporting portion 26c via a valve element fixing portion 26b, and the valve element supporting portion 26c is connected to a drive portion (not shown). The valve element supporting portion 26c is moved vertically and horizontally by the drive portion, which makes it possible to set a state where the opening 25 is hermetically blocked and a state where the opening 25 is opened, the valve element 26 lowers downward, and the wafer W can be carried in and out. A rim-shaped hermetically sealing member (O-ring) 26d made of rubber, resin, or the like to perform hermetic sealing by abutting on and being pressed against an outer side of the processing chamber 1 is provided in the valve element 26a. A microwave reflecting mechanism 26e which is formed in a groove shape so as to surround a periphery of the hermetically sealing member 26d is provided at an outer peripheral portion of the hermetically sealing member 26d.

Figure 5:
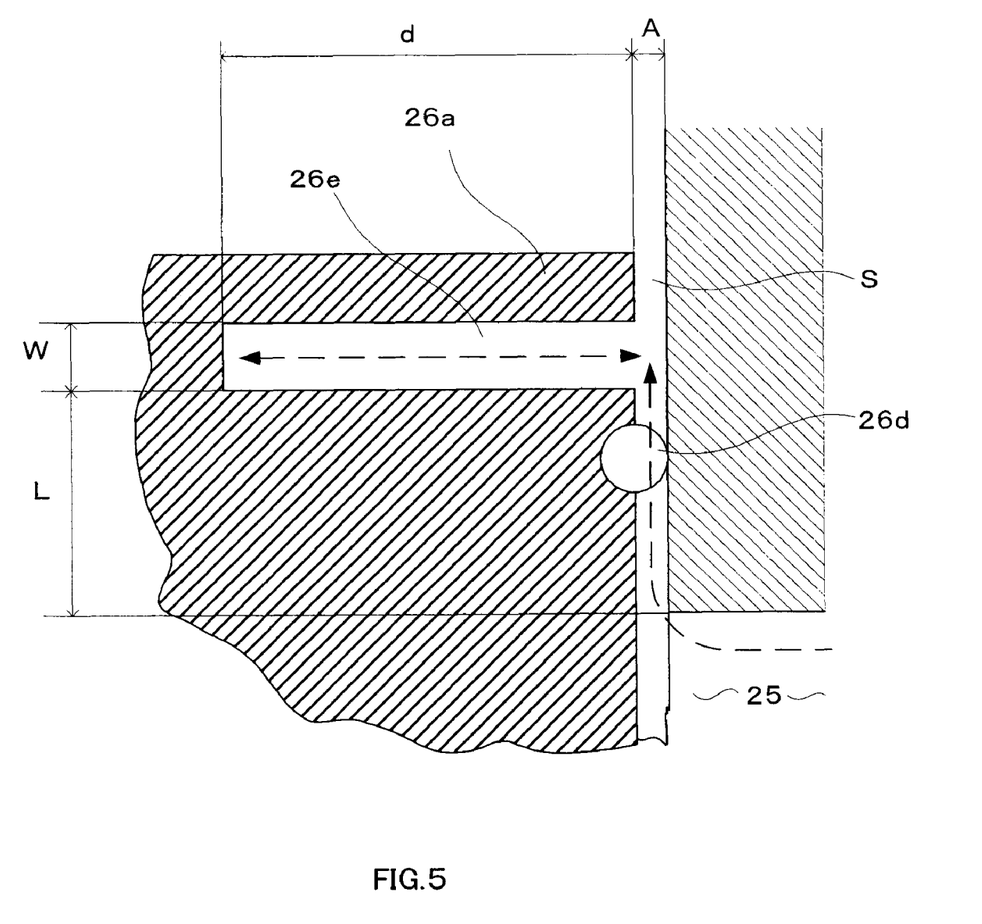
FIG. 5 is a longitudinal sectional view showing a part of FIG. 3 in an enlarged scale.

FIG. 5 shows a portion surrounded by a circle shown in FIG. 3 in an enlarged scale. As shown in FIG. 5, even in a state where the valve element 26a is pressed against the sidewall of the processing chamber 1 to hermetically seal the opening 25 in the gate valve 26 with the above constitution, a very small space S (a size A shown in the figure is, for example, approximately 0.4 mm) is formed between the body of the valve element 26a and the sidewall of the processing chamber 1 since the hermetically sealing member 26d is provided. Therefore, as shown by the arrows in the figure, the microwave is transmitted through the hermetically sealing member 26d from the opening 25 through the clearance S and propagated outward. Then, in this embodiment, this microwave diffracts at the microwave reflecting mechanism 26e region, enters the microwave reflecting mechanism 26e, returns by being reflected at a bottom portion, and is balanced out by an incident microwave, so that leakage to the outside is suppressed.

Figure 20:
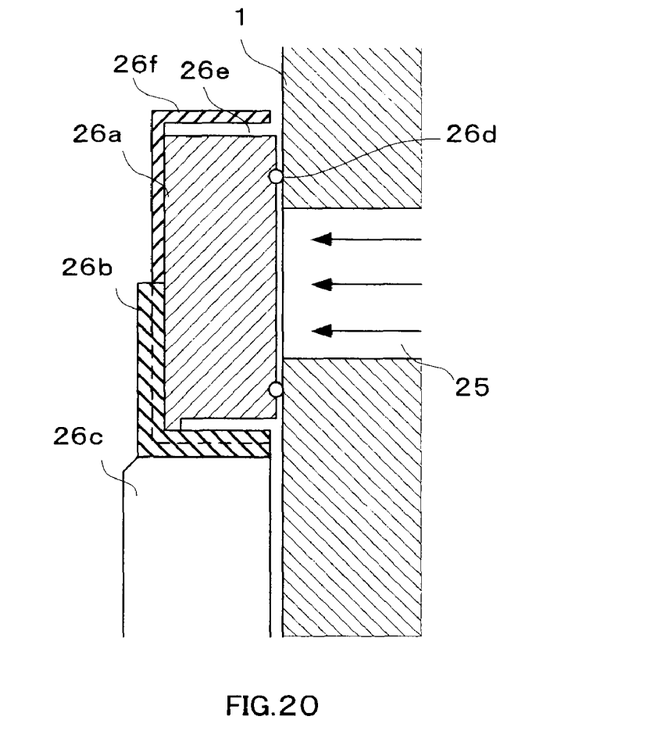
FIG. 20 is a longitudinal sectional view showing the constitution of a gate valve according to another embodiment.
Figure 21:
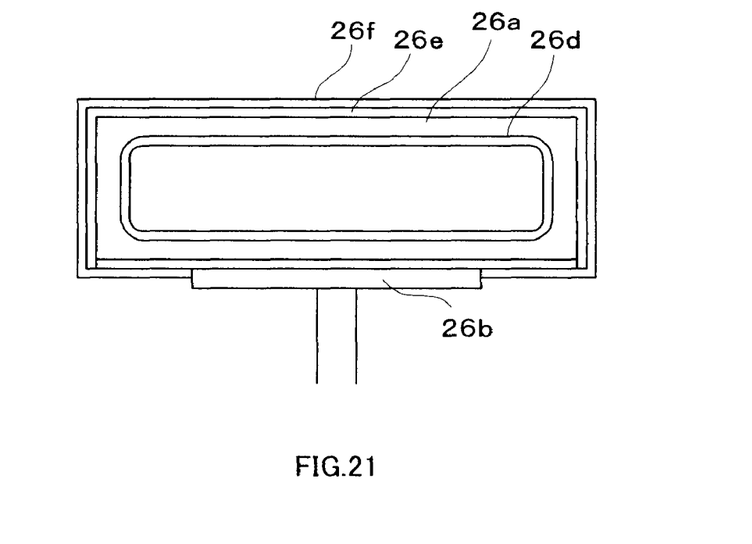
FIG. 21 is a front view showing the constitution of a valve element in FIG. 20.

Actually, the gate valve 26 equipped with the microwave reflecting mechanism 26e is fabricated, and in the microwave plasma processing device 100 with the constitution shown in FIG. 1, the leakage amount of the microwave is measured to be compared with that in the case of the gate valve 26 without the microwave reflecting mechanism 26e. The gate valve 26 provided with the microwave reflecting mechanism 26e used in the measurement is the one in which as shown in FIG. 20 and FIG. 21, the microwave reflecting mechanism 26e is formed by providing an outer member 26f so that the periphery of the valve element 26a is surrounded therewith with a predetermined space therebetween. As a result, when the microwave reflecting mechanism 26e is not provided, the average of nine measurements is 1.574 mW/cm$^2$. On the other hand, when the microwave reflecting mechanism 26e is provided, the average of nine measurements is 0.587 mW/cm$^2$, and the leakage amount can be reduced to approximately one third. Incidentally, the measurements are made when plasma is ignited under the conditions of a pressure of 666.65 Pa, a microwave power of 4000 W, a microwave wavelength of 124 nm, and a gas flow rate of Ar/O$_2$/H$_2$=1060/500/40 sccm. Further, the measurements are made at an observation window portion placed at an upper portion of the transfer chamber (not shown) provided on the side (left side) of the gate valve 26 shown in FIG. 1. In the microwave reflecting mechanism 26e on this occasion, a depth d of the groove shown in FIG. 5 is 20 mm at an upper portion and a side portion and 16 mm at a lower portion, a width S of the groove is 1.5 mm, and a distance L from an end portion of the opening 25 is 10 mm.

As just described, in this embodiment, the leakage of the microwave to the outside, for example, when the plasma is ignited can be suppressed without having such a constitution that metals come into direct contact with each other which causes an increase in particles, and thereby a possibility that an electric discharge or the like occurs due to the leaked microwave can be reduced compared to the related art.

Results of simulations to optimize the groove depth d, groove width W, and distance L from the end portion of the opening 25 shown in FIG. 5 in the above microwave reflecting mechanism 26e will be described below. Incidentally, the simulations are performed using electromagnetic wave simulation software (HFSS) (manufactured by Ansoft Corporation).

Figure 6:
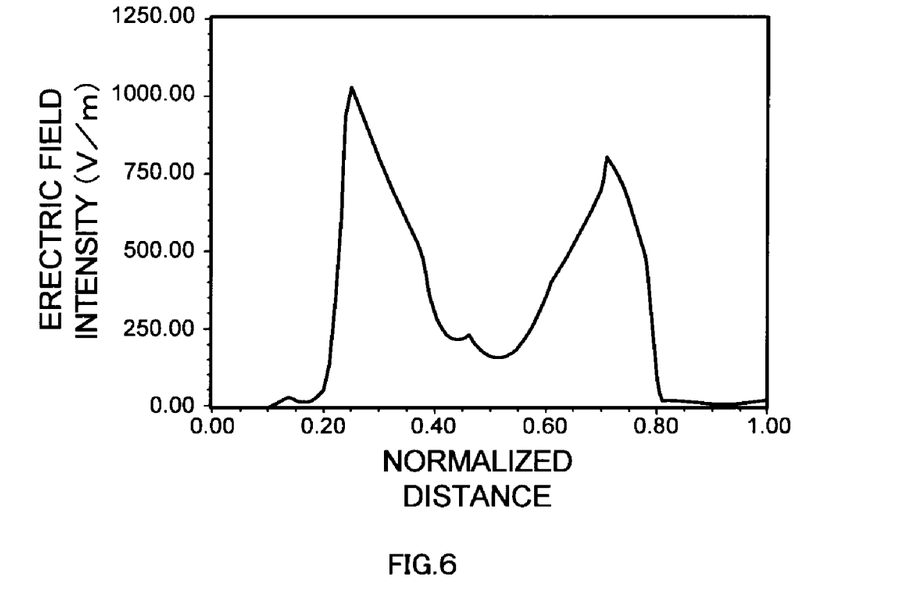
FIG. 6 is a graph showing a simulation result of the action of a plasma reflecting mechanism.
Figure 7:
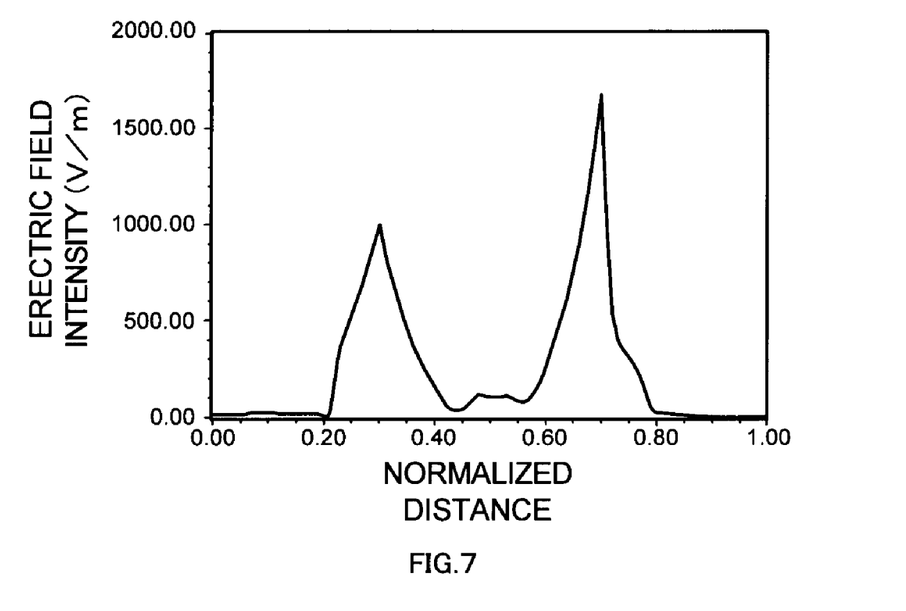
FIG. 7 is a graph showing a simulation result of the action of the plasma reflecting mechanism.
Figure 8:
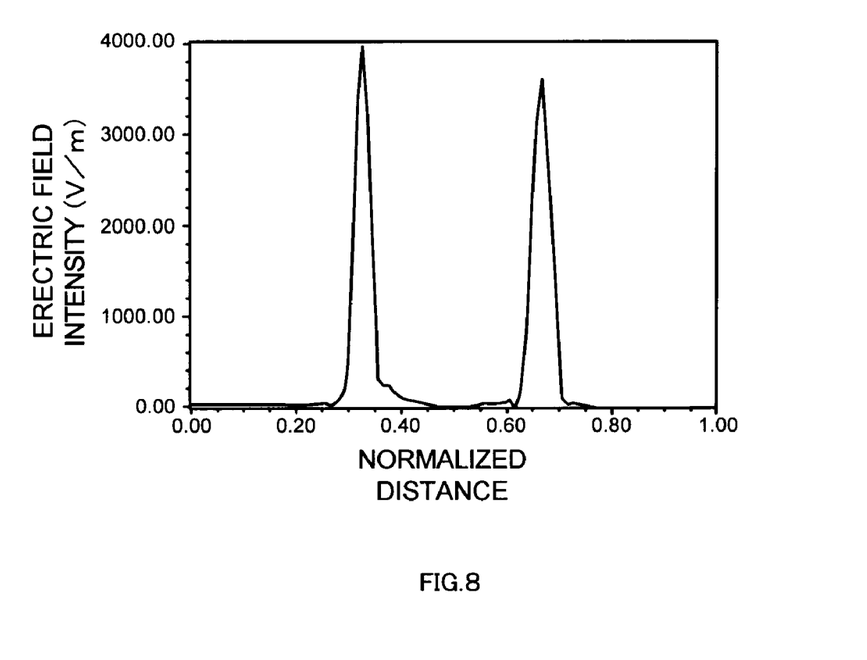
FIG. 8 is a graph showing a simulation result of the action of the plasma reflecting mechanism.

Graphs in FIGS. 6 to 8 show results of simulations of microwave intensity distribution with the vertical axis as an electric field intensity and the horizontal axis as a normalized distance in a top-to-bottom direction. Two peaks virtually show positions of the grooves 26e in the top-to-bottom direction, and portions outside these peaks (left and right outer sides in the figure) substantially show the intensity of the microwave which has leaked to the outside. FIG. 6, FIG. 7, and FIG. 8 show cases of L=10 mm, L=5 mm, and L=2 mm, respectively, and in any case, W=5 mm, and d=31 mm. From these results, when L is at least in a range from 2 mm to 10 mm, the distance L has little influence on the leakage of the microwave to the outside, and in any case, leakage to the outside hardly occurs. Note, however, that in the case of L=2 mm, its peak is high, and its potential is approximately 4000 V/m, which may cause the influence of heat generation. Relations between the potential of this peak and L (mm) are shown in Table 1.

TABLE 1

|  | L (mm) | | |
|---|---|---|---|
|  | 2 | 5 | 10 |
| Peak Potential (V/m) | 4000 | 1700 | 1000 |

As shown in Table 1, when the heat generation due to a rise in peak potential is taken into consideration, L is preferably set to 5 mm or more, and more preferably set to, for example, approximately 10 mm.

Figure 9:
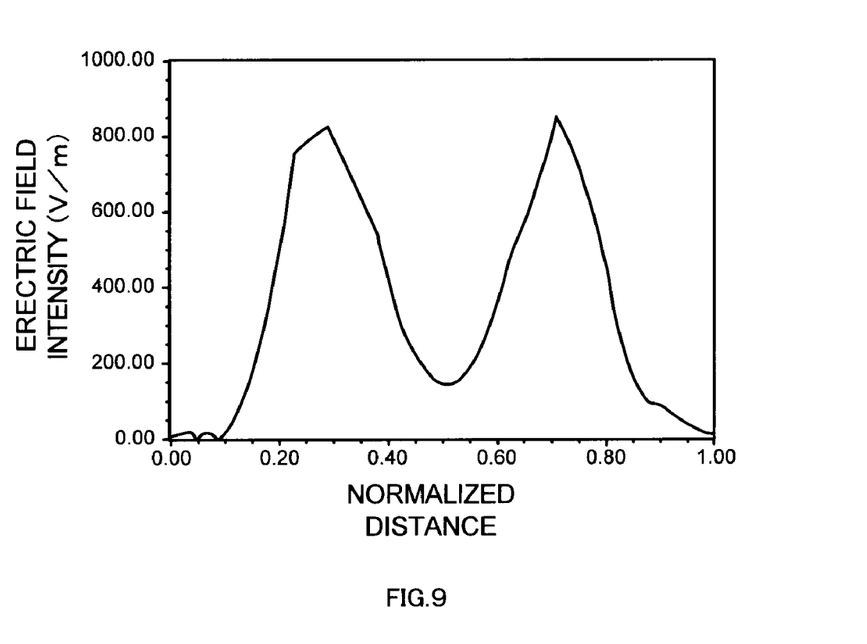
FIG. 9 is a graph showing a simulation result of the action of the plasma reflecting mechanism.
Figure 10:
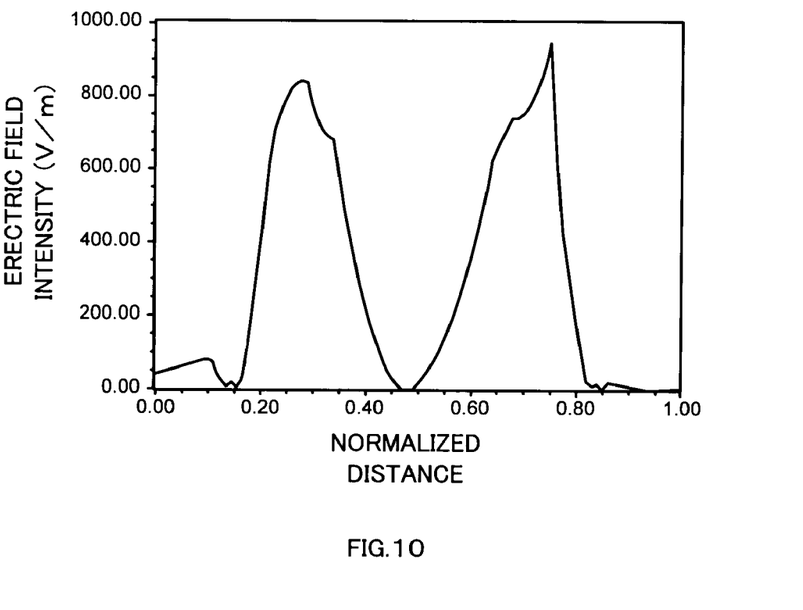
FIG. 10 is a graph showing a simulation result of the action of the plasma reflecting mechanism.
Figure 11:
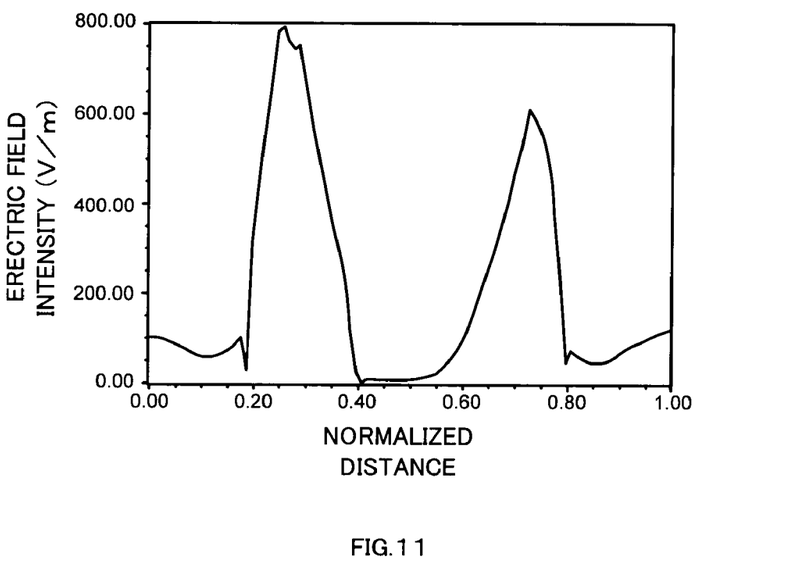
FIG. 11 is a graph showing a simulation result of the action of the plasma reflecting mechanism.

Graphs in FIGS. 9 to 11 show results when W is changed in a similar manner (L=10 mm, d=31 mm in any case). FIG. 9, FIG. 10, and FIG. 11 show cases of W=20 mm, W=10 mm, and W=3 mm, respectively. Results of W (mm) and the microwave leakage amount in FIG. 6 and FIGS. 9 to 11 are shown in Table 2.

TABLE 2

|  | W (mm) | | | |
|---|---|---|---|---|
|  | 3 | 5 | 10 | 20 |
| Microwave Leakage Amount | Large | Small | Small | Small |

These results show that the leakage amount of the microwave to the outside increases to some extent in the case of W=3 mm as shown in FIG. 11 but the leakage amount of the microwave can be reduced by the setting of W=5 mm or more. Meanwhile, if W is increased more than necessary, the need for increasing the size of the entire valve element arises, and consequently W is preferably set in a range more than 3 mm and less than 10 mm, and more preferably set to approximately 5 mm shown in FIG. 6.

Figure 12:
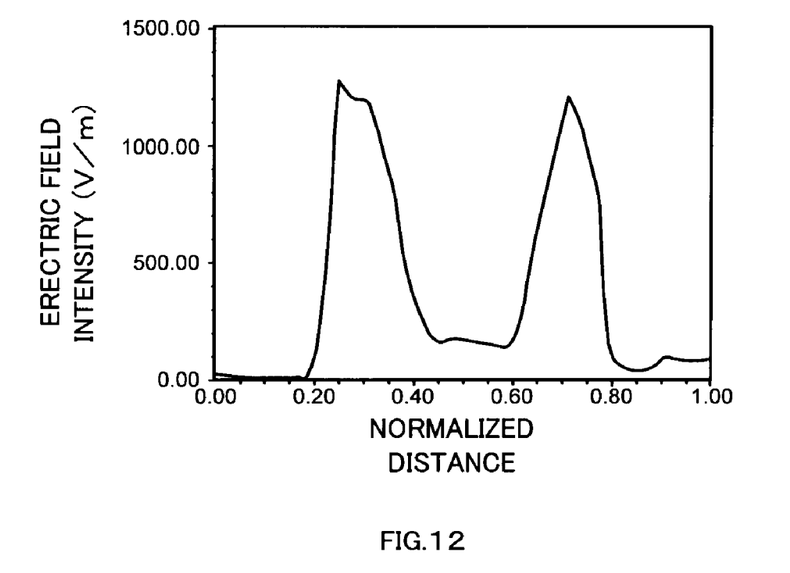
FIG. 12 is a graph showing a simulation result of the action of the plasma reflecting mechanism.
Figure 13:
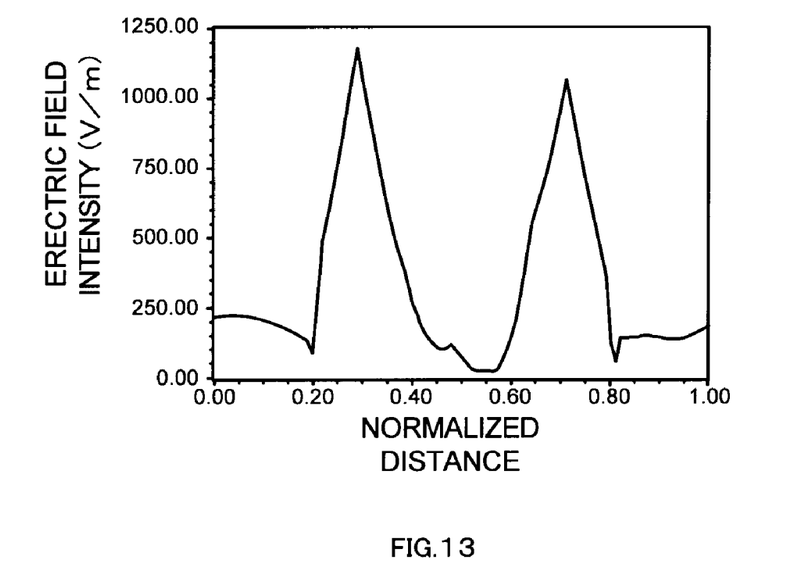
FIG. 13 is a graph showing a simulation result of the action of the plasma reflecting mechanism.
Figure 14:
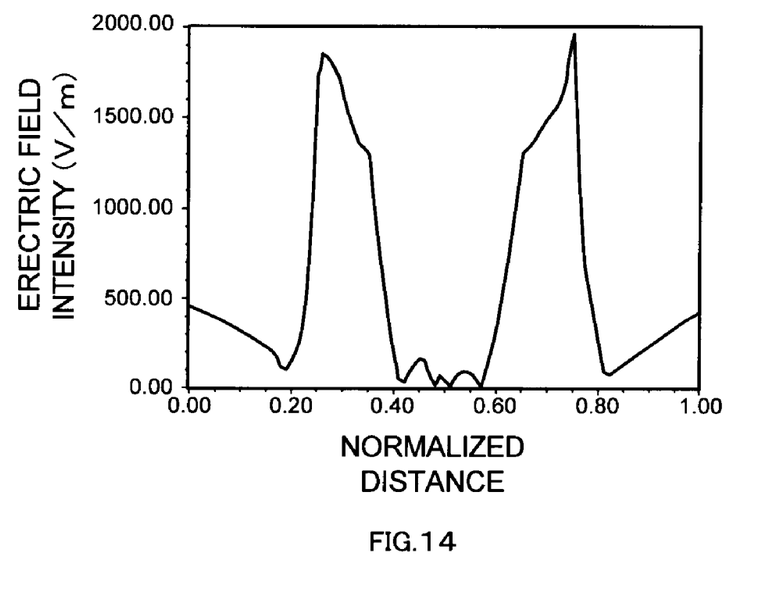
FIG. 14 is a graph showing a simulation result of the action of the plasma reflecting mechanism.

Graphs in FIGS. 12 to 14 show results when d is changed in a similar manner (L=10 mm, W=5 mm in any case). FIG. 12, FIG. 13, and FIG. 14 show cases of d=16 mm, d=10 mm, and d=5 mm, respectively. Results of d (mm) and the microwave leakage amount in FIG. 6 and FIGS. 12 to 14 are shown in Table 3.

TABLE 3

|  | d (mm) | | | |
|---|---|---|---|---|
|  | 5 | 10 | 16 | 31 |
| Microwave Leakage Amount | Large | Large | Small | Small |

As shown also in Table 3, according to the above results, in the cases of d=5 mm and d=10 mm, the leakage of the microwave to the outside increases to some extent. Accordingly, d is preferably set to 16 mm or more, and more preferably set to 31 mm or more shown in FIG. 6. Incidentally, since the wavelength of the microwave used in the above simulations is approximately 124 mm, d is preferably set to one-eighth wavelength or more, and more preferably set to approximately one-quarter wavelength.

Figure 15:
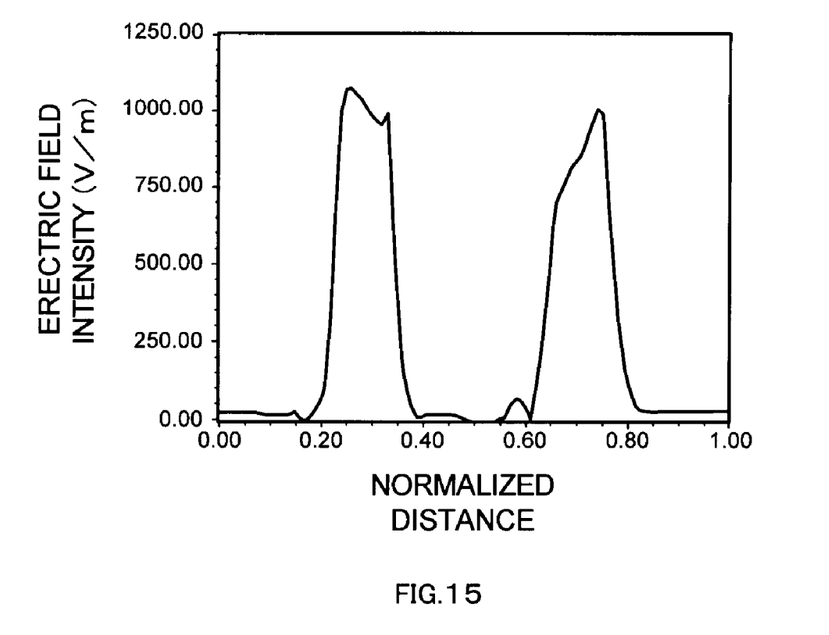
FIG. 15 is a graph showing a simulation result of the action of the plasma reflecting mechanism.
Figure 16:
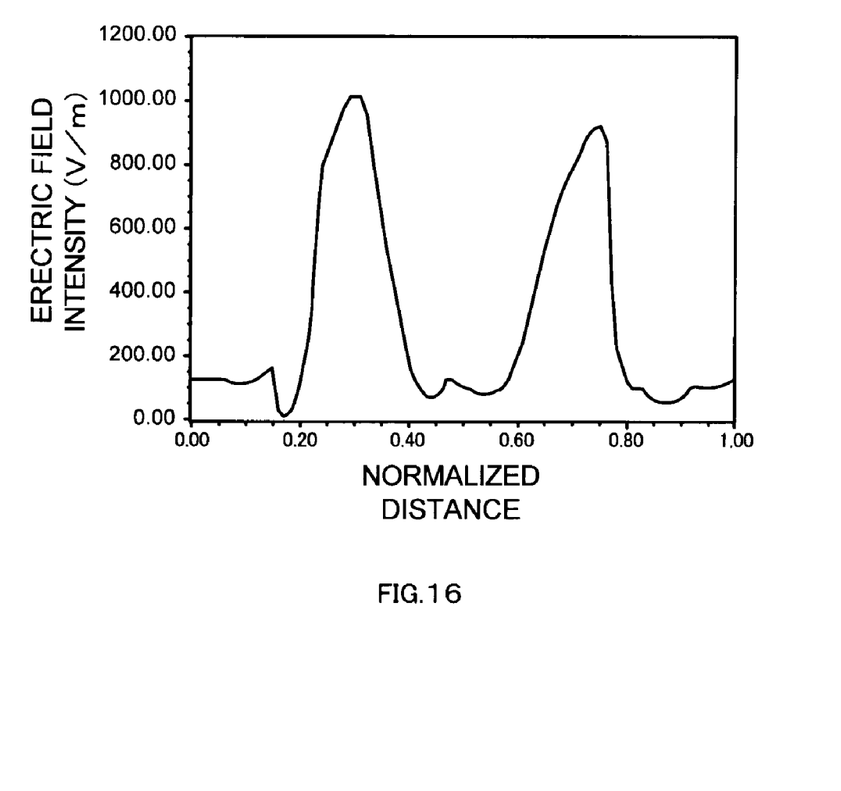
FIG. 16 is a graph showing a simulation result of the action of the plasma reflecting mechanism.
Figure 17:
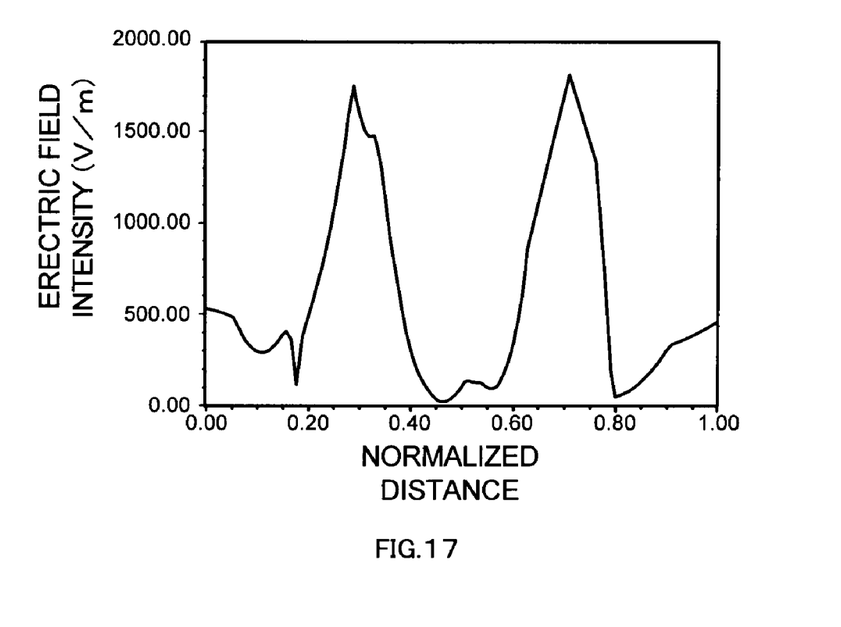
FIG. 17 is a graph showing a simulation result of the action of the plasma reflecting mechanism.

As a result of the above, for example, as shown in FIG. 6, by the setting of L=10 mm, W=5 mm, and d=31 mm, the leakage of the microwave to the outside can be reduced to almost nothing. Further, the above wavelength of the microwave is a wavelength in a vacuum, and the wavelength of the microwave changes according to the dielectric constant of a medium through which the microwave propagates. Hence, results of simulations of cases where the wavelength of the microwave is changed, for example, by filling the groove of the microwave reflecting mechanism 26e with a substance (quartz) having a high dielectric are shown in graphs in FIG. 15 to FIG. 19. FIG. 15 to FIG. 17 show results when d is changed, and FIG. 15, FIG. 16, and FIG. 17 show cases of d=15 mm, d=10 mm, and d=5 mm, respectively (L=10 mm, W=5 mm in any case). Results of d (mm) and the microwave leakage amount in FIGS. 15 to 17 are shown in Table 4.

TABLE 4

|  | d (mm) | | |
|---|---|---|---|
|  | 5 | 10 | 15 |
| Microwave Leakage Amount | Large | Large | Small |

As shown also in Table 4, according to the above results, in the cases of d=5 mm, and d=10 mm, the leakage of the microwave to the outside increases to some extent. Accordingly, d is preferably set to 15 mm or more.

Figure 18:
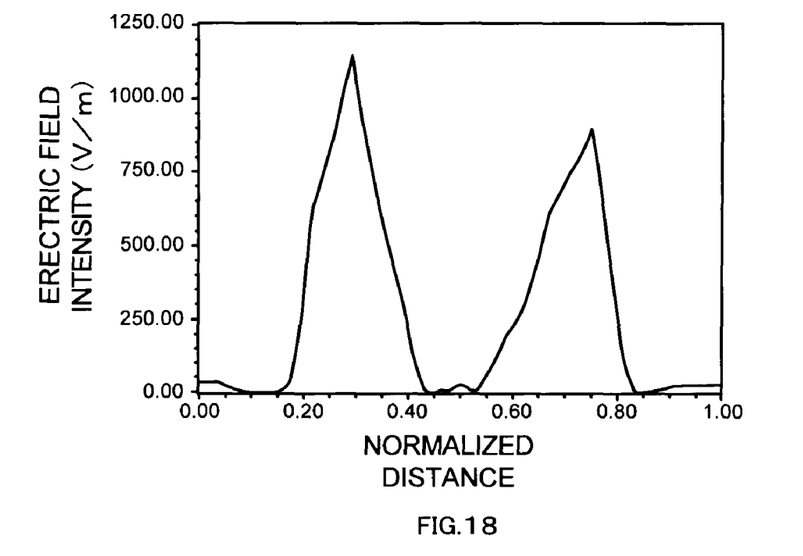
FIG. 18 is a graph showing a simulation result of the action of the plasma reflecting mechanism.
Figure 19:
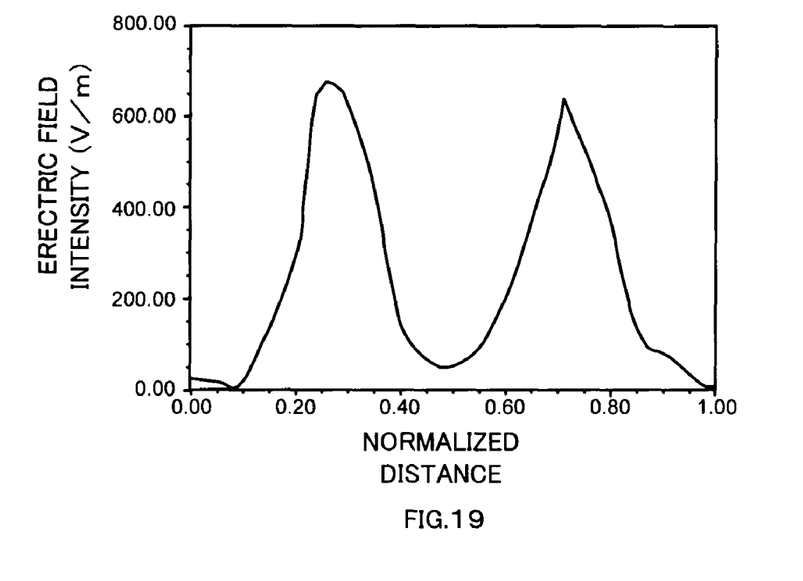
FIG. 19 is a graph showing a simulation result of the action of the plasma reflecting mechanism.

FIGS. 18 and 19 show results of simulations of cases where W is changed when the groove of the microwave reflecting mechanism 26e is filled with quartz as described above. FIG. 18 and FIG. 19 show cases of W=10 mm and W=20 mm, respectively, and L=10 mm and d=15 mm in either case. From the results of FIGS. 15, 18, and 19, the leakage of the microwave is hardly found in either case when W is in a range from 5 mm to 20 mm. Accordingly, as shown in FIG. 15, W is preferably set to approximately 5 mm in terms of device miniaturization.

Figure 22:
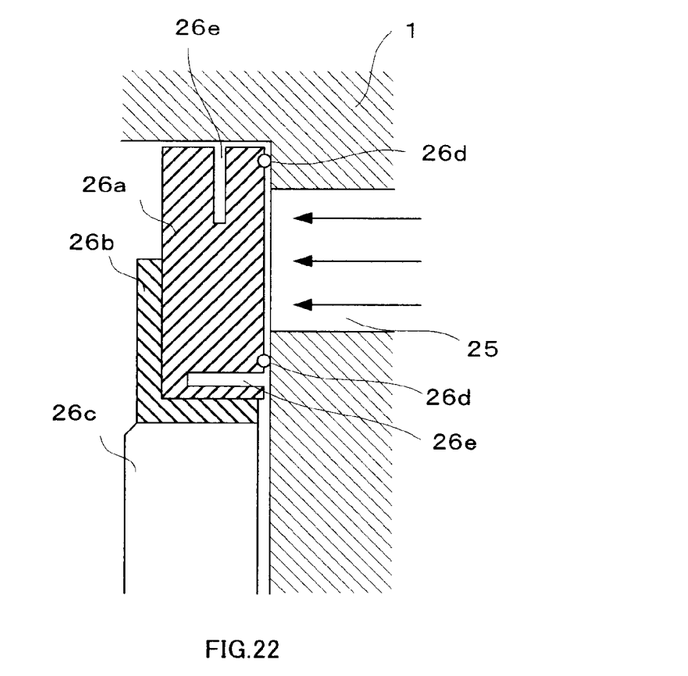
FIG. 22 is a longitudinal sectional view showing the constitution of a gate valve according to another embodiment.
Figure 23:
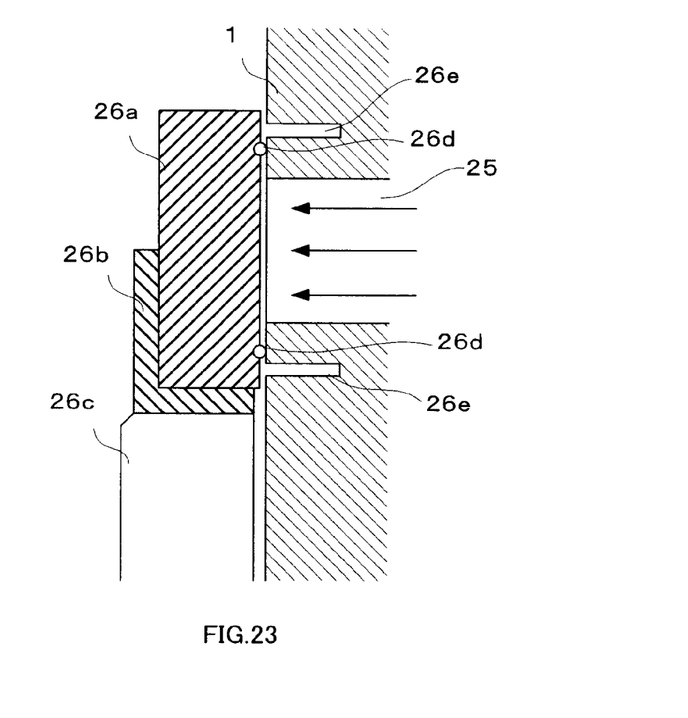
FIG. 23 is a longitudinal sectional view showing the constitution of a gate valve according to another embodiment.

FIGS. 22 and 23 show other constitutional examples of the microwave reflecting mechanism 26e. As shown in FIG. 22, a part (an upper-side portion in FIG. 22) of the microwave reflecting mechanism 26e may be provided toward a direction other than the opening 25 side so as to face another member. Further, as shown in FIG. 23, the microwave reflecting mechanism 26e can be provided on the processing chamber 1 side instead of the valve element 26a side. Furthermore, in the above embodiment, the case where the microwave reflecting mechanism 26e is provided on the outside of the hermetically sealing member has been described, but the microwave reflecting mechanism 26e may be provided on the inside of the hermetically sealing member 26d.

Next, the microwave plasma processing operation of the microwave plasma processing device 100 shown in FIG. 1 will be described. First, the gate valve 26 is opened, and the wafer W is carried into the processing chamber 1 from the opening 25 and placed on the susceptor 2. Subsequently, the inside of the processing chamber 1 is evacuated, and predetermined processing gas is introduced into the processing chamber 1 via the gas introducing member 15 at a predetermined flow rate. Then, the pressure in the processing chamber 1 is regulated to a pressure state in which the plasma is easy to ignite.

Next, the plasma is ignited by radiating the microwave into the processing chamber 1. On this occasion, first, the microwave from the microwave generator 39 is guided to the waveguide 37 through the matching circuit 38. The microwave is supplied to the planar antenna member 31 through the rectangular waveguide 37b, the mode converter 40, and the coaxial waveguide 37a in sequence, and radiated from the planar antenna member 31 to a space above the wafer W in the processing chamber 1 through the microwave transmitting plate 28. Thus, in the processing chamber 1, the gas is converted into the plasma by the microwave radiated into the processing chamber 1. After the plasma is ignited, the pressure in the processing chamber 1 is regulated to a predetermined pressure, and predetermined microwave plasma processing is performed.

Then, after the predetermined processing is performed on the wafer W by the above microwave plasma, the radiation of the microwave is stopped to extinguish the plasma, and the gas is stopped while evacuation is performed to end the sequence of processing. After this, the gate valve 26 is opened, and the wafer W is carried out of the opening 25.

While the embodiments of the present invention have been described above in detail with reference to the drawings, the present invention is not intended to be limited to the above embodiments, and various design changes and the like may be made therein without departing from the spirit of the present invention.

What is claimed is:

1. A microwave plasma processing device processing an object to be processed by plasma generated by a microwave, comprising:
    a processing chamber having an opening to carry the object to be processed in and out;
    a microwave introducing mechanism to introduce the microwave into said processing chamber;
    a valve element openably and closably blocking the opening;
    an exhauster evacuating the processing chamber;
    a hermetically sealing member between an outer atmospheric portion of a peripheral portion of the opening of said processing chamber and the valve element to hermetically seal a space therebetween while the opening is blocked by said valve element; and
    a groove-shaped microwave reflecting mechanism configured to reflect the microwave leaking to an outside from the opening while the opening is blocked by the valve element, the microwave reflecting mechanism being located so as to surround at least a periphery of the opening and being joined with a space formed by the hermetically sealing member between the outer atmospheric portion of a peripheral portion of said processing chamber opening and the valve element,
    wherein the microwave reflecting mechanism is provided in the valve element to surround an outer peripheral portion of said hermetically sealing member of the valve element.

2. The microwave plasma processing device according to claim 1, wherein the microwave reflecting mechanism has a depth of approximately one quarter of a wavelength of the microwave.

3. The microwave plasma processing device according to claim 1, wherein a groove-shaped portion of the microwave reflecting mechanism is filled with a dielectric.

4. The microwave plasma processing device according to claim 1, wherein the microwave introducing mechanism includes a planar antenna having plural slots.

5. The microwave plasma processing device according to claim 4, wherein the planar antenna is a radial line slot antenna (RLSA).

6. The microwave plasma processing device according to claim 1,
    wherein a distance from an end of the opening to an end of the microwave reflecting mechanism is more than 5 mm.

7. The microwave plasma processing device according to claim 1, wherein a width of a groove of the microwave reflecting mechanism is more than 5 mm and less than 10 mm.

8. A gate valve for a microwave plasma processing device configured to be placed in the microwave plasma processing device including an opening portion to carry an object to be processed into and out of a processing chamber, introducing a microwave into the processing chamber to generate plasma while the processing chamber is evacuated, and processing the object to be processed by the plasma, the gate valve comprising:
    a valve element openably and closably blocking the opening portion;
    a hermetically sealing member between an outer atmospheric portion of a peripheral portion of the opening portion of the processing chamber and the valve element to hermetically seal a space therebetween while the opening portion is blocked by said valve element; and
    a groove-shaped microwave reflecting mechanism configured to reflect the microwave leaking to an outside from the opening while the opening is blocked by the valve element, the microwave reflecting mechanism being located so as to surround at least a periphery of the opening portion and being joined with a space formed by the hermetically sealing member between the outer atmospheric portion of a peripheral portion of said processing chamber opening and the valve element,
    wherein the microwave reflecting mechanism is provided in the valve element to surround an outer peripheral portion of said hermetically sealing member of the valve element.

9. The gate valve for the microwave plasma processing device according to claim 8, wherein the microwave reflecting mechanism has a depth of approximately one quarter of a wavelength of the microwave.

10. The gate valve for the microwave plasma processing device according to claim 8,
wherein a groove-shaped portion of the microwave reflecting mechanism is filled with a dielectric.

11. The gate valve for the microwave plasma processing device according to claim 8,
wherein a distance from an end of the opening portion to an end of the microwave reflecting mechanism is more than 5 mm.

12. The gate valve for the microwave plasma processing device according to claim 8,
wherein a width of a groove of the microwave reflecting mechanism is more than 5 mm and less than 10 mm.

* * * * *